(12) United States Patent
Chang et al.

(10) Patent No.: US 8,545,061 B2
(45) Date of Patent: Oct. 1, 2013

(54) LIGHT EMITTING DIODE DEVICE WITH LENS HAVING A CAVITY

(75) Inventors: Chao-Hsiung Chang, Hsinchu (TW); Hou-Te Lin, Hsinchu (TW); Ming-Ta Tsai, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 51 days.

(21) Appl. No.: 13/288,031

(22) Filed: Nov. 3, 2011

(65) Prior Publication Data
US 2012/0224379 A1    Sep. 6, 2012

(30) Foreign Application Priority Data

Mar. 3, 2011   (CN) .......................... 2011 1 0051110

(51) Int. Cl.
*F21V 3/00*     (2006.01)
*F21V 5/00*     (2006.01)

(52) U.S. Cl.
USPC ........................................ 362/311.06; 257/98

(58) Field of Classification Search
USPC ............... 362/311.02, 311.06, 311.09, 311.1, 362/310; 257/79, 98, 99, 100; 313/110, 313/112, 116, 113, 498, 512, 501
See application file for complete search history.

(56) References Cited

U.S. PATENT DOCUMENTS

| | | | |
|---|---|---|---|
| 2006/0092532 A1* | 5/2006 | Ouderkirk et al. ............ | 359/819 |
| 2008/0191232 A1* | 8/2008 | Lee et al. .......................... | 257/98 |
| 2010/0201256 A1* | 8/2010 | Xue et al. ....................... | 313/504 |
| 2011/0114979 A1* | 5/2011 | Jang ................................. | 257/98 |
| 2012/0113621 A1* | 5/2012 | Lee et al. ...................... | 362/97.1 |

FOREIGN PATENT DOCUMENTS

TW    M337842U  U    8/2008

* cited by examiner

*Primary Examiner* — Mariceli Santiago
*Assistant Examiner* — Glenn Zimmerman
(74) *Attorney, Agent, or Firm* — Altis & Wispro Law Group, Inc.

(57) ABSTRACT

An LED device includes a substrate, an LED chip and a lens module. The substrate has an upper surface. The LED chip is arranged on the upper surface of the substrate. The LED chip has a light emitting surface away from the upper surface of the substrate. The lens module is arranged over the light emitting surface of the LED chip. The lens module includes a first lens. The first lens includes a first light outputting surface away from the light emitting surface of the LED chip. The first light outputting surface of the first lens defines a first cavity at a center thereof.

12 Claims, 9 Drawing Sheets

LIGHT EMITTING DIODE DEVICE WITH LENS HAVING A CAVITY

BACKGROUND

1. Technical Field

The disclosure relates to light emitting diode (LED) devices, and particularly to a light emitting diode device with even distribution of light emission.

2. Discussion of Related Art

Light emitting diodes' (LEDs) many advantages, such as high luminosity, low operational voltage, low power consumption, compatibility with integrated circuits, faster switching, long term reliability, and environmental friendliness have promoted their wide use as a lighting source.

However, the conventional LED illumination apparatus generally generates a butterfly-type light field or has a radiation angle about 120 degrees. The intensity of light emitted by the LEDs is unevenly distributed; the light intensity dramatically decreases when the radiation angle exceeds 120 degrees.

Therefore, what is needed is an LED device which can overcome the described limitations.

BRIEF DESCRIPTION OF THE DRAWINGS

Many aspects of the disclosure can be better understood with reference to the following drawing. The components in the drawing are not necessarily drawn to scale, the emphasis instead being placed upon clearly illustrating the principles of the present light emitting diode device for microminiaturization. Moreover, in the drawing, like reference numerals designate corresponding parts throughout the whole view.

DETAILED DESCRIPTION OF EMBODIMENTS

Figure 1:
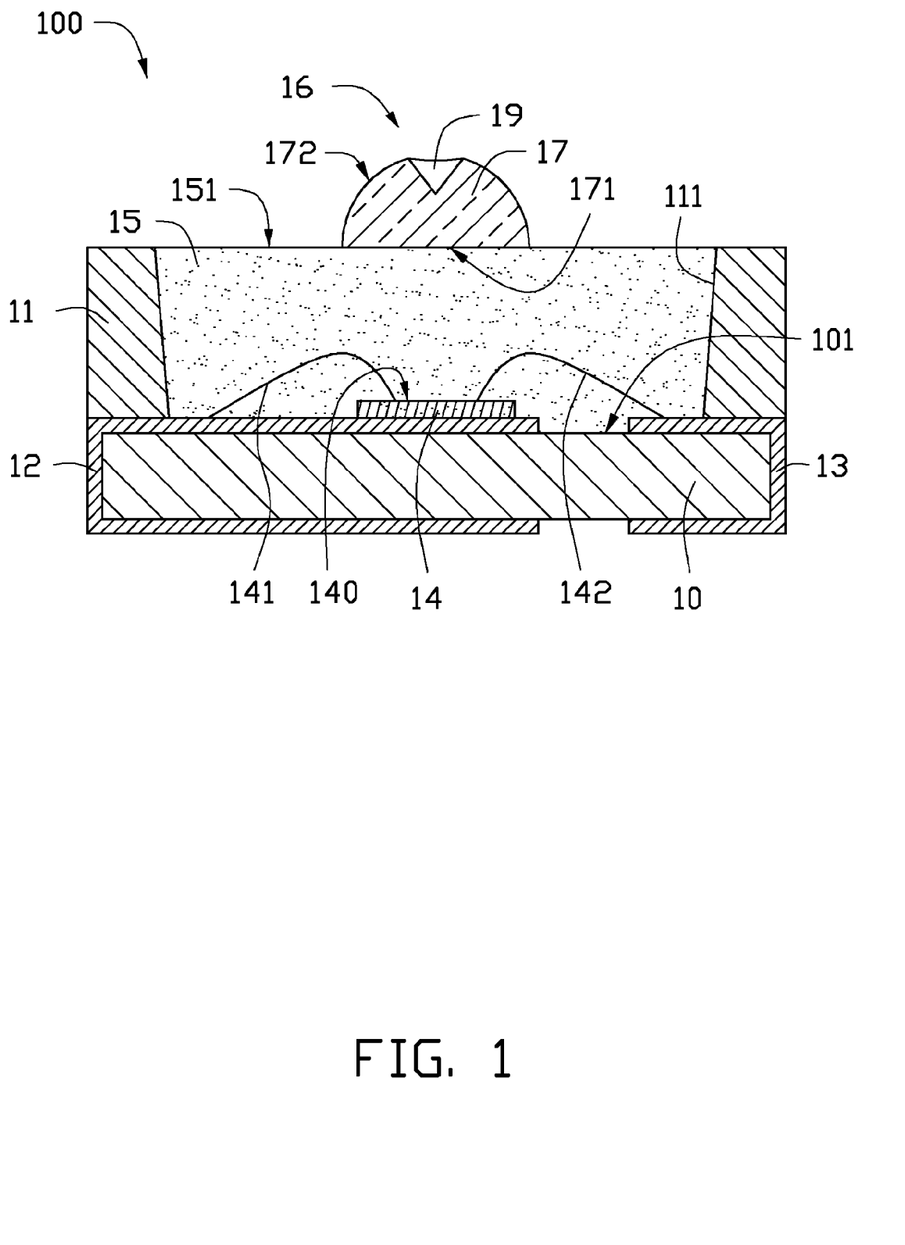
FIG. 1 is a cross-sectional view of an LED device in accordance with a first embodiment of the present disclosure.

Referring to FIG. 1, an LED device 100 in accordance with a first embodiment of the present disclosure is illustrated. The LED device 100 includes a substrate 10, an LED chip 14 mounted on the substrate 10, an annular reflecting cup 11 arranged on the substrate 10 and surrounding the LED chip 14, a first electrical portion 12 and a second electrical portion 13 formed on two ends of the substrate 10, an encapsulant 15 received in the reflecting cup 11 and covering the LED chip 14, and a lens module 16 arranged on the encapsulant 15.

The substrate 10 beneficially is a single rectangular plate and has a planar upper surface 101. The first electrical portion 12 and the second electrical portion 13 extend from the upper surface 101 of the substrate 10 to a bottom face (not labeled) thereof along an outer edge of the substrate 10, whereby the LED device 100 is formed as a surface mounting type device.

The reflecting cup 11 surrounds the LED chip 14. The reflecting cup 11 defines a through hole 111 at a center thereof. The reflecting cup 11 can be made of a mixture which includes titanium dioxide ($TiO_2$), hardener, and a compound of epoxy resin and silicone. Also, the substrate 10 and the reflecting cup 11 can be formed integrally from the same material as a single piece, such as liquid crystal polymer (LCP).

The LED chip 14 is arranged on the first electrical portion 12 and located at a center of a bottom of the reflecting cup 11. A first electrode (not labeled) of the LED chip 14 is electrically connected to the first electrical portion 12 via a first wire 141, and a second electrode (not labeled) of the LED chip 14 is electrically connected to the second electrical portion 13 via a second wire 142. The LED chip 14 has a light emitting surface 140 away from the substrate 10.

The encapsulant 15 is filled in the reflecting cup 11 and covers the LED chip 14. The encapsulant 15 is made of transparent materials, such as silicone, epoxy, quartz, or glass. In this embodiment, a top surface 151 of the encapsulant 15 is substantially coplanar with a top surface of the reflecting cup 11.

Figure 2:
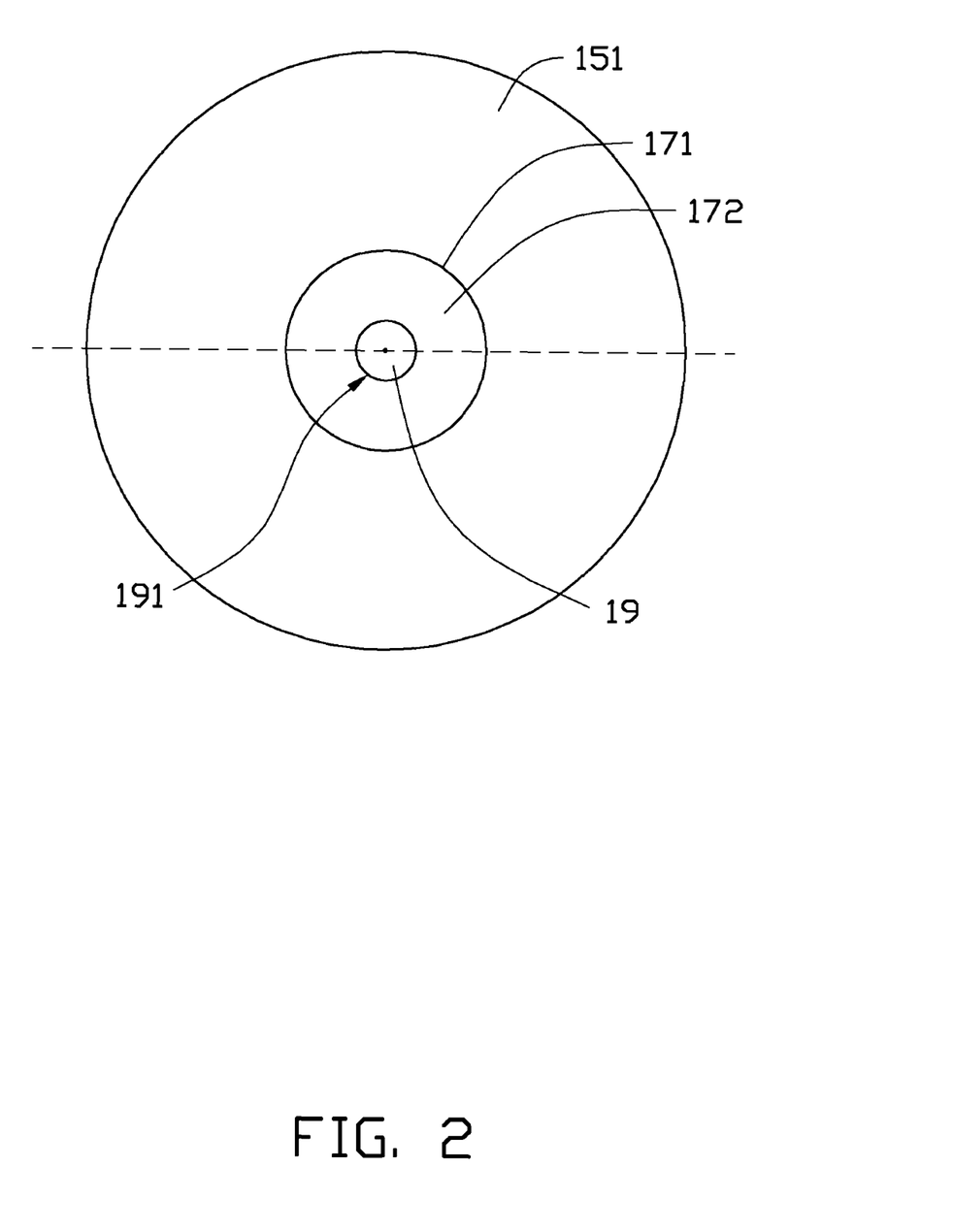
FIG. 2 is a top view of a lens module and a light emitting surface of the LED device of FIG. 1.
Figure 3:
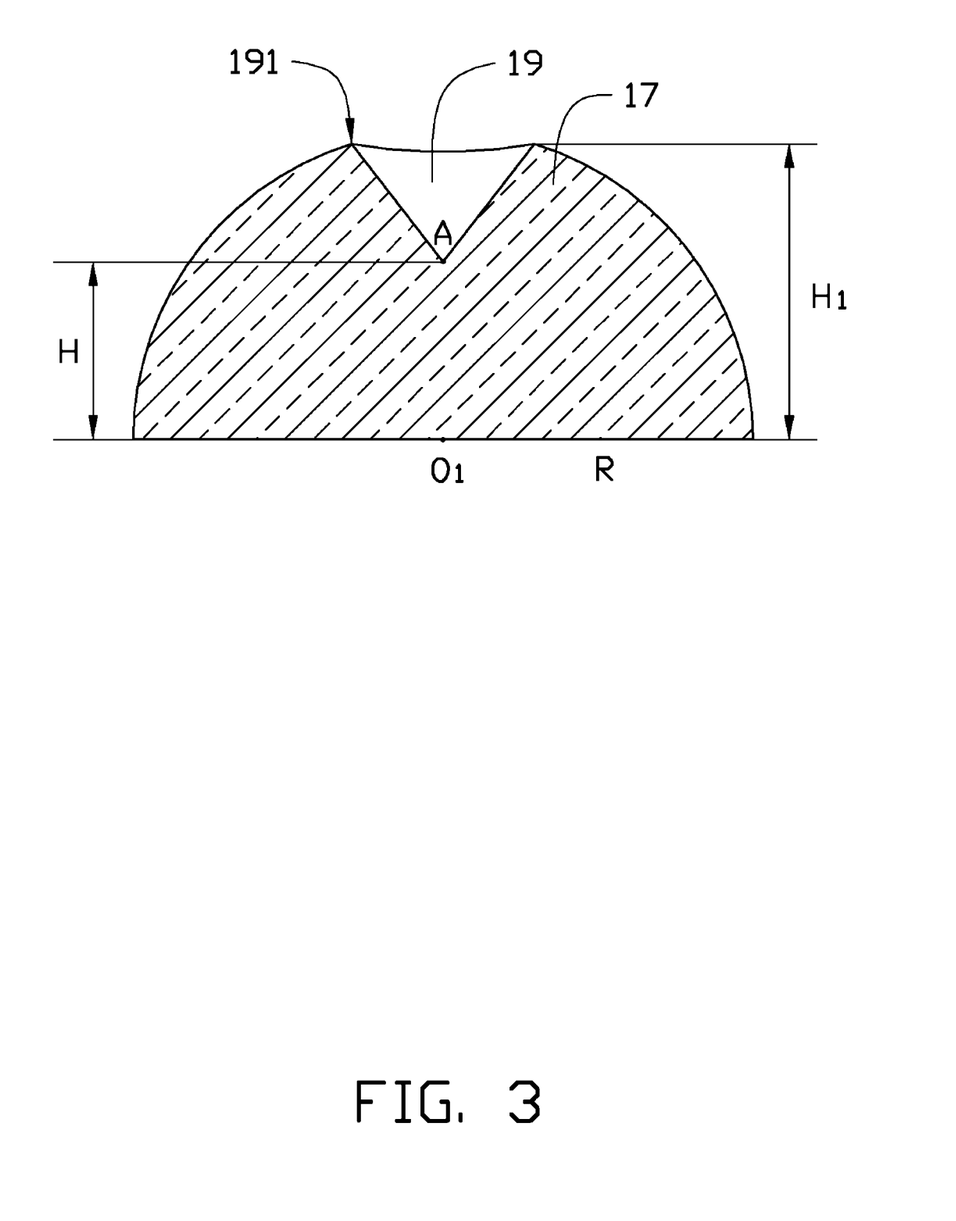
FIG. 3 is an enlarged view of the lens module of the LED device of FIG. 1.

Referring also to FIGS. 2-3, the lens module 16 is arranged on the top surface 151 of the encapsulant 15. In the present embodiment, the lens module 16 includes a lens 17. The lens 17 is mounted over the LED chip 14. The lens 17 includes a light inputting surface 171 attached to a center of the top surface 151 of the encapsulant 15, and a light outputting surface 172 facing an outer environment. The lens 17 has a hemispherical shape with a spherical radius R and a spherical center $O_1$. The light inputting surface 171 is a circular planar surface whose radius is equal to the radius R, and the light outputting surface 172 is a hemispherical surface whose radius is equal to the radius R. In the present embodiment, the top surface 151 of the encapsulant 15 is a circular planar surface. The center of the top surface 151 is in alignment with the center of the light inputting surface 171. In an alternative embodiment, the light inputting surface 171 of the lens 17 can be designed to have a size equal to the top surface 151 of the encapsulant 15; in other words, the light inputting surface 17 covers all of the top surface 151.

In the present embodiment, the lens 17 defines a cavity 19 at a center of a top thereof. The cavity 19 has a conical shape. A central axis of the cavity 19 extends through the center $O_1$ of the lens 17. The second light outputting surface 172 defines a bounding circle 191 around the cavity 19. The cavity 19 has a lowest point A.

A distance between the lowest point A of the cavity 19 and the center $O_1$ is H. The distance H and the radius R of the lens 17 satisfy a condition:

$$\tfrac{1}{8}R \leq H \leq \tfrac{1}{4}R.$$

A distance between the bounding circle 191 and the light inputting surface 171 of the lens 17 is $H_1$. The distance $H_1$ and the radius R satisfy a condition:

$$\tfrac{1}{4}R \leq H_1 \leq \tfrac{1}{2}R.$$

Light emitted from a center of the LED chip 14 is scattered by the light outputting surface 172 of the lens 17 to different directions; furthermore, the cavity 19 can scatter the light emitted from the LED chip 14 to different directions; therefore, the light emission of the LED device 100 can be substantially evenly distributed.

Figure 4:
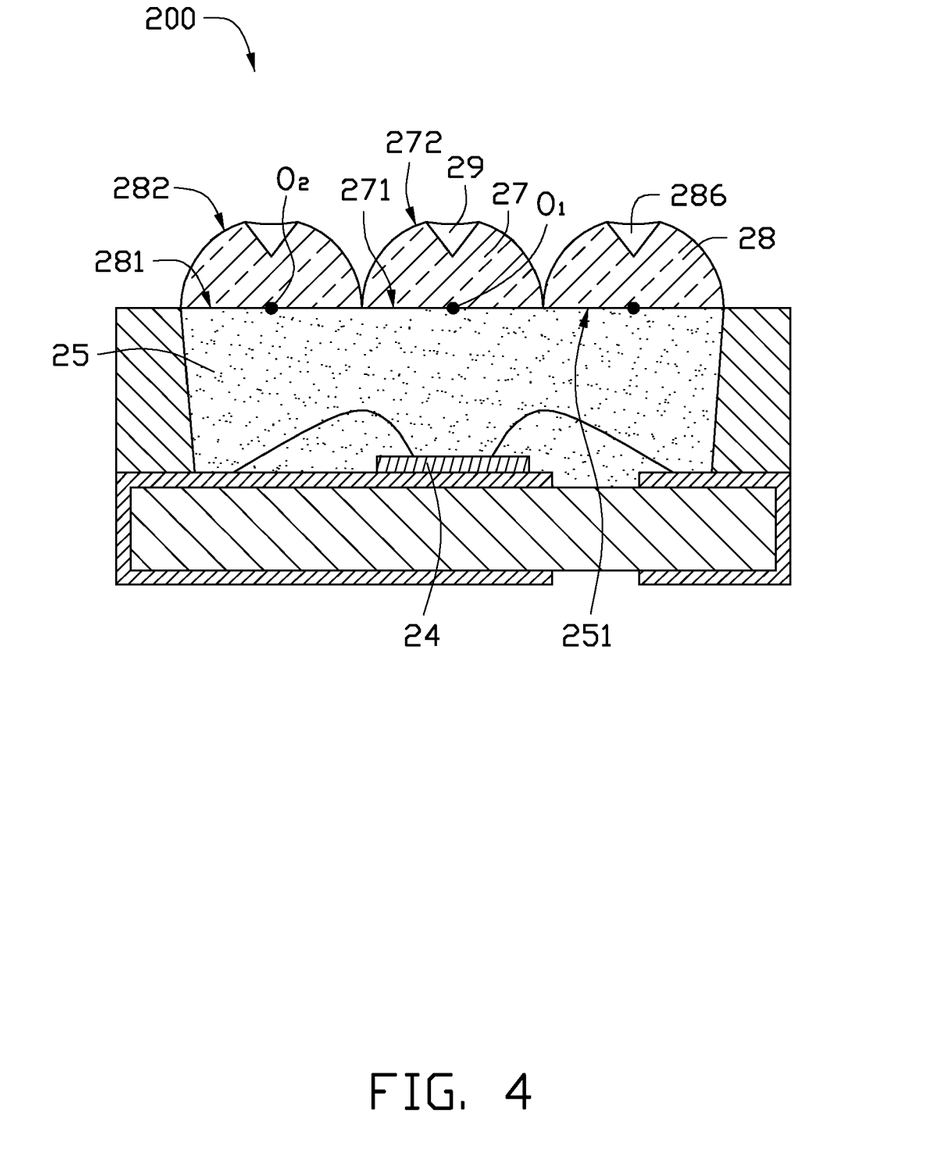
FIG. 4 is a cross-sectional view of an LED device in accordance with a second embodiment of the present disclosure.
Figure 5:
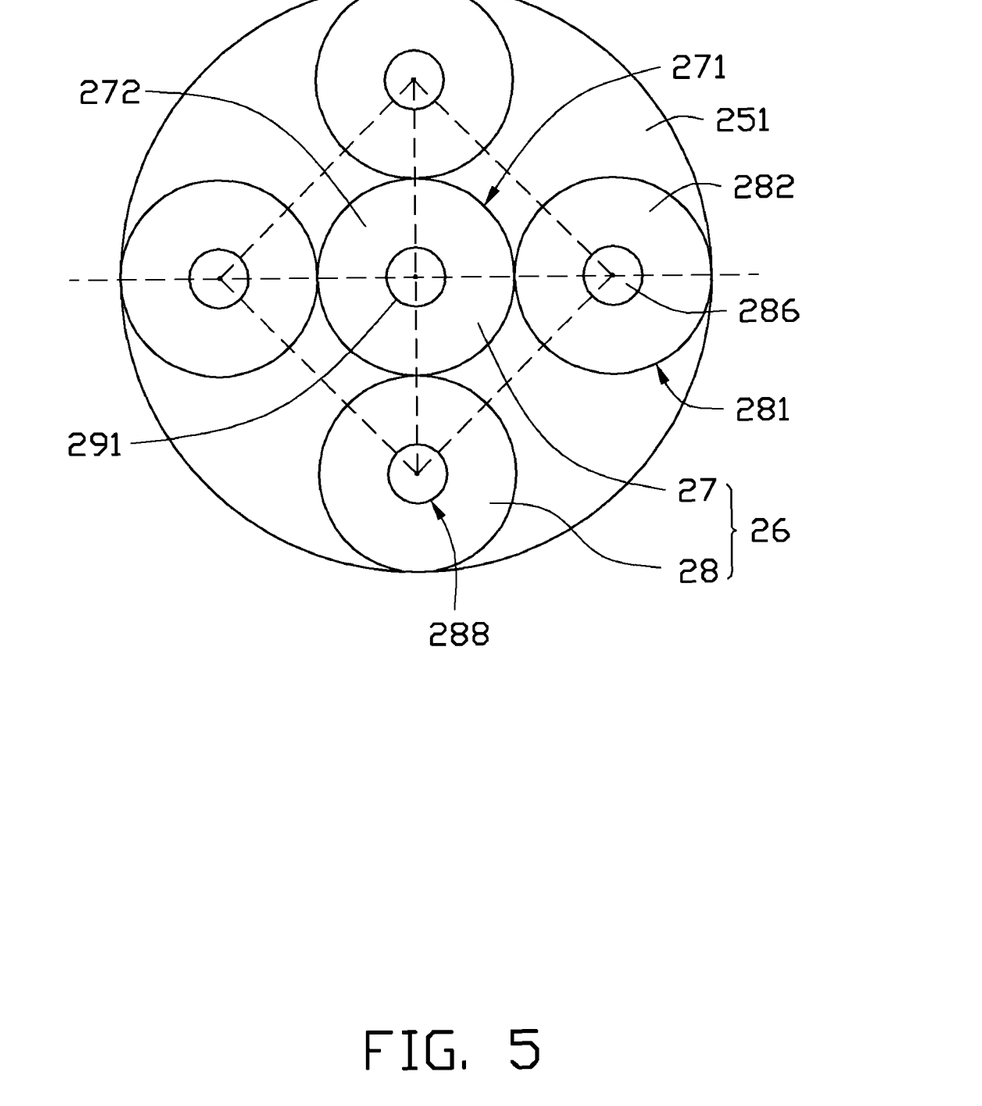
FIG. 5 is a top view of a lens module and a light emitting surface of the LED device of FIG. 4.

Referring to FIGS. 4-5, an LED device 200 in accordance with a second embodiment of the present disclosure is illustrated. The LED device 200 is similar to the LED device 100 of the first embodiment. Differing from the LED device 100 of the first embodiment, a lens module 26 of the LED device 200 includes a first lens 27 and a plurality of second lenses 28 around the first lens 27.

In the present embodiment, an amount of the second lenses 28 is four, and the second lenses 28 each have a structure substantially the same as that of the first lens 27. Each second lens 28 has a hemispherical shape with a spherical radius R and a spherical center $O_2$. Each second lens 28 includes a second light inputting surface 281 and a second light outputting surface 282. The second light inputting surface 281 is a circular planar surface with a radius which is equal to the radius R, and the second light outputting surface 282 is a hemispherical surface with a spherical radius which is equal to the radius R. The second lenses 28 are evenly arranged on the top surface 251 of the encapsulant 25 around the first lens 27. Lines connecting the four centers $O_2$ of the second lenses 28 cooperatively define a square. The first lens 27 is located at a center of the square. In the present embodiment, a first light inputting surface 271 of the first lens 27 is tangential to the second light inputting surface 281 of each of the second lenses 28. The top surface 251 of the encapsulant 25 is a circular planar surface with a radius which is equal to the triple of the radius R; the center $O_1$ of the first lens 27 is superposed with the center of the top surface 251; the second light inputting surface 281 of each of the second lenses 28 is tangential to a peripheral edge of the top surface 251. In alternative embodiment, a radius of each of the second lenses 28 can be less than the radius R, and thus the first lens 27 and the second lenses 28 can be spaced from each other.

Figure 6:
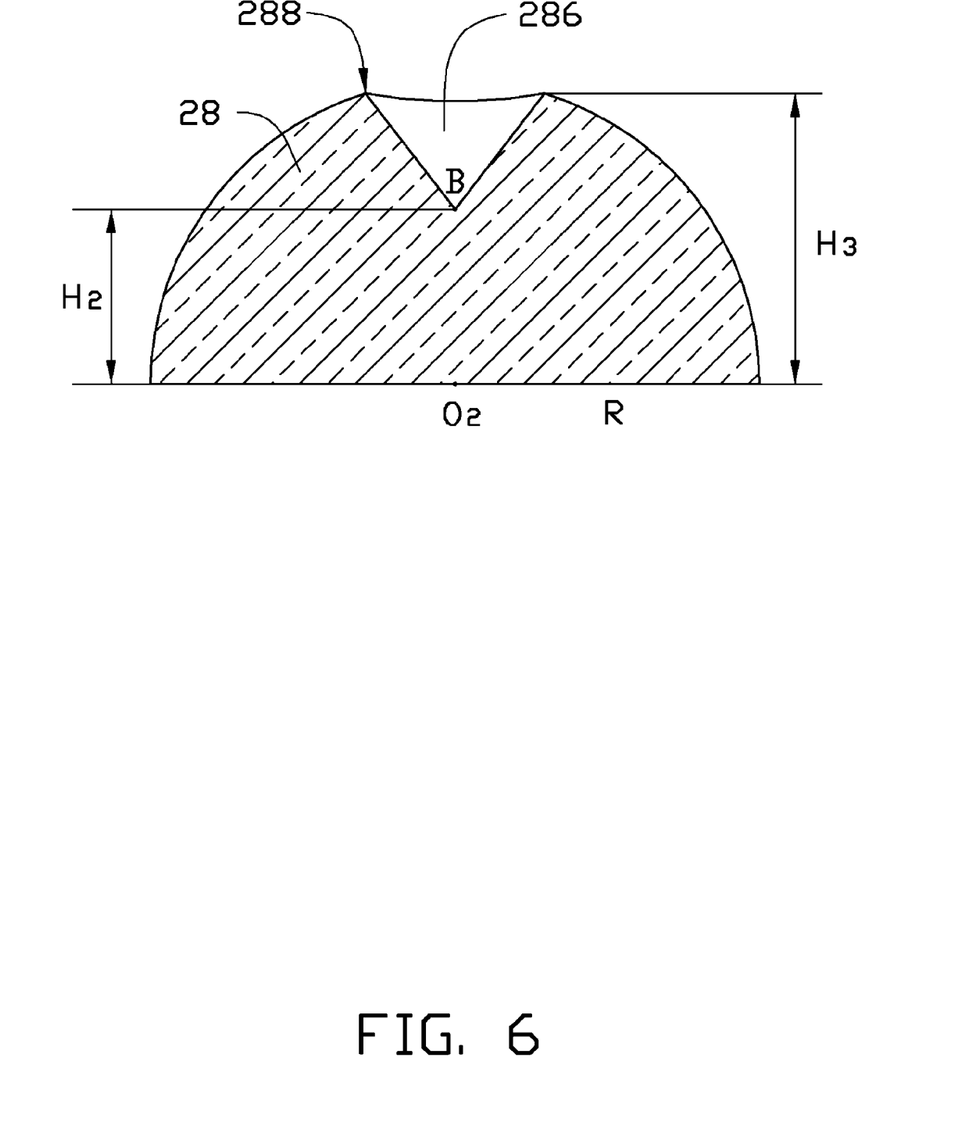
FIG. 6 is an enlarged view of a lens of the lens module of the LED device of FIG. 4.

Referring also to FIG. 6, the first lens 27 has a first cavity 29 extending downwardly from a central portion of a first light outputting surface 272 thereof. The second lens 28 has a second cavity 286 extending from a central portion of the second light outputting surface 282. The first light outputting surface 272 defines a first bounding circle 291 around the first cavity 29. The second cavity 286 has a conical shape. The second cavity 286 has a lowest point B. A central axis of the second cavity 286 extends through the spherical center of the second lens 28. The second light outputting surface 282 defines a second bounding circle 288 around the second cavity 286. The first cavity 29 is the same as the second cavity 286 either in shape or in size.

A distance between the lowest point B of the second cavity 286 and the spherical center $O_2$ is $H_2$. The distance $H_2$ and the spherical radius R of the second lens 28 satisfy a condition:

$\frac{1}{8}R \leq H_2 \leq \frac{1}{4}R$.

A distance between the second bounding circle 288 and the second light inputting surface 281 of the second lens 28 is $H_3$. The distance $H_3$ and the spherical radius R satisfy a condition:

$\frac{1}{4}R \leq H_3 \leq \frac{1}{2}R$.

Figure 7:
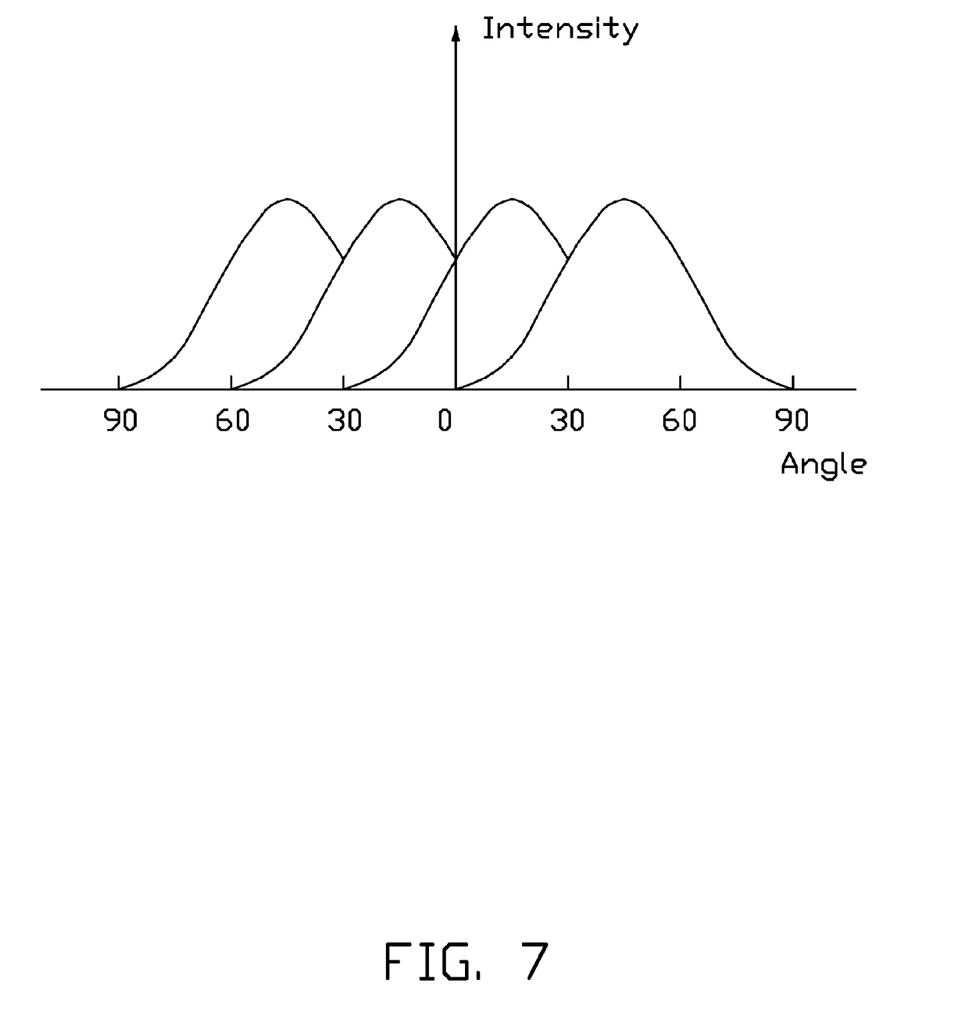
FIG. 7 is a diagram showing a light intensity distribution of the LED device of FIG. 4.

Referring to FIG. 7 also, light emitted from a center of an LED chip 24 of the second LED device 200 is scattered by the first cavity 29 and the second cavities 286; therefore, the light emission of the LED device 200 can be substantially evenly distributed.

Figure 8:
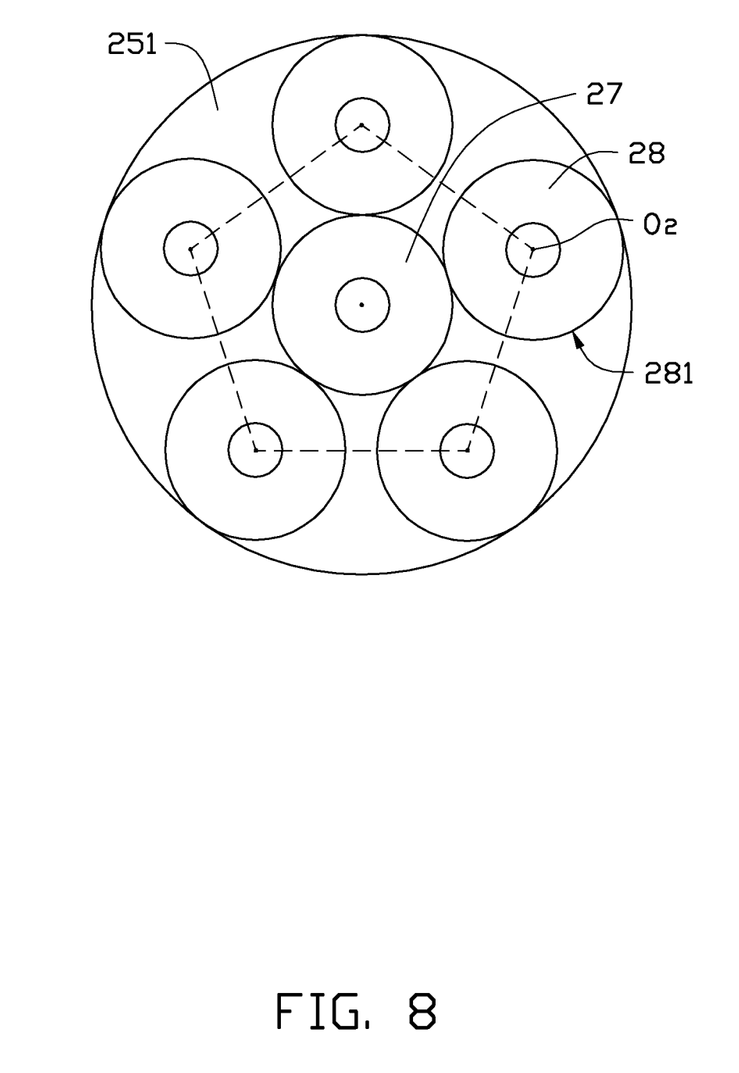
FIG. 8 is a top view of a lens module and a light emitting surface of an LED device in accordance with an alternative embodiment.

In alternative embodiment, the second lenses 28 can be one, two, three, or more than four. Referring to FIG. 8, a top view of a third embodiment of an LED device is shown. In this embodiment, the LED device includes five second lenses 28 arranged around and tangential to the first lens 27, and second light inputting surfaces 281 of the second lenses 28 are tangential to a peripheral edge of the top surface 251 and the first lens 27. Lines connecting the centers $O_2$ of the second lenses 28 cooperatively form a pentagon.

Figure 9:
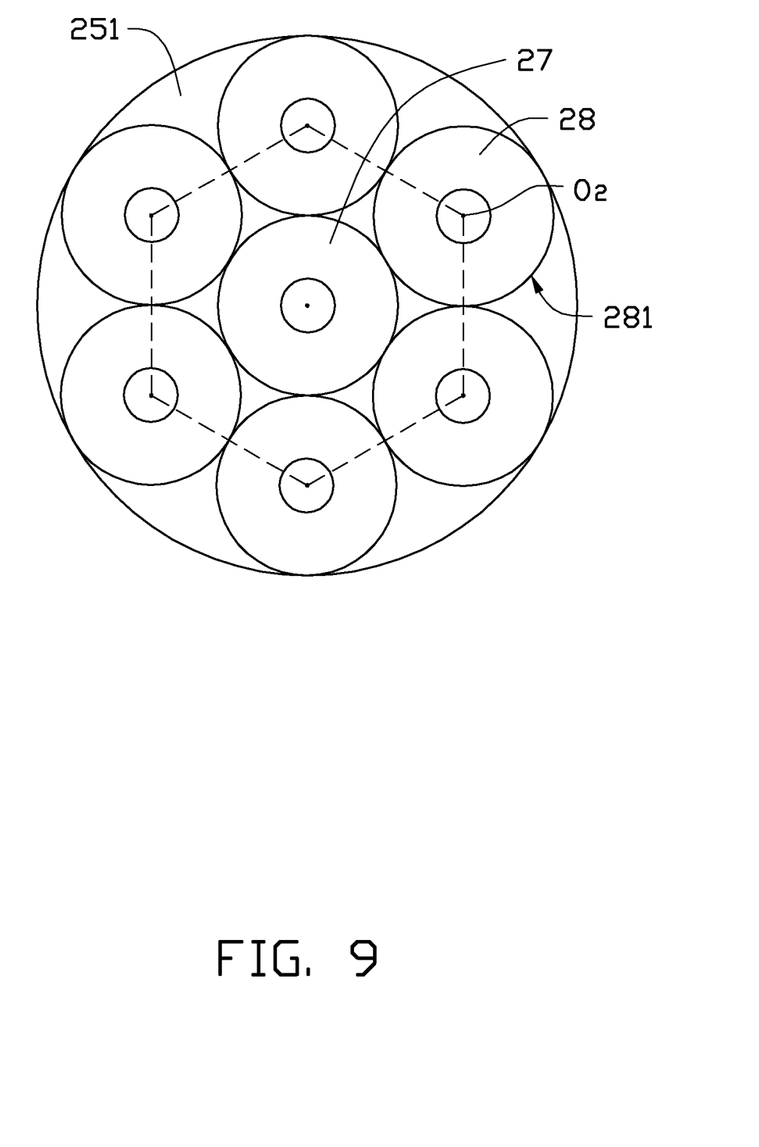
FIG. 9 is a top view of a lens module and a light emitting surface of an LED device in accordance with a further alternative embodiment.

Referring to FIG. 9, a fourth embodiment of an LED device having six second lenses 28 is shown. The six second lenses 28 are arranged around the first lens 27 and are tangential to the first lens 27, and the second light inputting surface 281 of each of the second lenses 28 is tangential to a peripheral edge of the top surface 251. Moreover, the second light inputting surface 281 of each of the second lenses 28 is tangential to that of an adjacent second lens 28. Lines connecting the centers $O_2$ of the second lenses 28 cooperatively form a hexagon.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A light emitting diode (LED) device, comprising:
   a substrate having an upper surface;
   an LED chip arranged on the upper surface of the substrate, the LED chip having a light emitting surface away from the upper surface of the substrate; and
   a lens module arranged over the light emitting surface of the LED chip, the lens module comprising a first lens, the first lens comprising a first light outputting surface away from the light emitting surface of the LED chip, the first light outputting surface of the first lens defining a first cavity at a center of a top thereof;
   wherein the first lens has a hemispherical shape;
   wherein the first cavity has a conical shape, and a central axis of the first cavity extends through a spherical center of the first lens; and
   wherein a distance H between a lowest point of the first cavity and a spherical center of the first lens and a spherical radius R of the first lens satisfy a condition:

$\frac{1}{8}R \leq H \leq \frac{1}{4}R$.

2. The LED device of claim 1, wherein the first lens comprises a first light inputting surface facing the LED chip, the first light outputting surface defining a first bounding circle around the first cavity, and a distance $H_1$ between the first bounding circle and the first light inputting surface of the first lens and the spherical radius R satisfy a condition:

$\frac{1}{4}R \leq H_1 \leq \frac{1}{2}R$.

3. The LED device of claim 1, wherein the lens module further comprises a second lens, the second lens comprising a second light outputting surface away from the light emitting surface of the LED chip, the second light outputting surface of the second lens defining a second cavity at a center thereof.

4. The LED device of claim 3, wherein the first and second lenses each have a hemispherical shape, and the first and second cavities each have a conical shape.

5. The LED device of claim 1, wherein the lens module further comprises a plurality of second lenses, each of the second lenses comprising a second light outputting surface away from the light emitting surface of the LED chip, the second light outputting surface of each of the second lenses defining a second cavity at a center thereof.

6. The LED device of claim 5, wherein the first and second lenses each have a hemispherical shape, and the first and second cavities each have a conical shape.

7. The LED device of claim 5, wherein the first lens is directly over the LED chip, and the second lenses are arranged around the first lens.

8. The LED device of claim 5, wherein the first lens comprises a first light inputting surface and each of the second lenses comprises a second light inputting surface, the first and second light inputting surfaces being planar, the first light inputting surface of the first lens being tangential to the second light inputting surface of each of the second lenses.

9. The LED device of claim 1, further comprising a reflecting cup arranged on the substrate and surrounding the LED chip, an encapsulant being received in the reflecting cup and covering the LED chip, the encapsulant comprising a top surface away from the LED chip, the lens module being arranged on the top surface of the encapsulant.

10. An LED device, comprising:
a substrate having an upper surface;
an LED chip arranged on the upper surface of the substrate;
a reflecting cup arranged on the upper surface of the substrate and surrounding the LED chip;
an encapsulant being received in the reflecting cup and covering the LED chip; and
a lens arranged on the encapsulant, the lens comprising a light inputting surface facing the LED chip, a light outputting surface facing an outer environment, and a cavity concaved inwards from the light outputting surface of the lens;
wherein the lens has a hemispherical shape;
wherein the cavity has a conical shape, and a central axis of the cavity extends through a spherical center of the lens; and
wherein a distance H between a lowest point of the cavity and the spherical center of the lens and a spherical radius R of the lens satisfy a condition:

$$\tfrac{1}{8}R \leq H \leq \tfrac{1}{4}R.$$

11. The LED device of claim 10, wherein the cavity is aligned with the LED chip.

12. An LED device, comprising:
an LED chip for generating light to illuminate an outer environment;
an encapsulant encapsulating the LED chip; and
a lens arranged on the encapsulant, the lens comprising a light outputting surface facing the outer environment and a cavity concaved inwards from the light outputting surface of the lens, the cavity being aligned with the LED chip;
wherein the lens has a hemispherical shape;
wherein the cavity has a conical shape, and a central axis of the cavity extends through a spherical center of the lens; and
wherein a distance H between a lowest point of the cavity and the spherical center of the lens and a spherical radius R of the lens satisfy a condition:

$$\tfrac{1}{8}R \leq H \leq \tfrac{1}{4}R.$$

* * * * *